United States Patent [19]

Edwards et al.

[11] 4,266,334

[45] May 12, 1981

[54] MANUFACTURE OF THINNED SUBSTRATE IMAGERS

[75] Inventors: Thomas W. Edwards, Mount Joy; Ronald S. Pennypacker, East Petersburg, both of Pa.

[73] Assignee: RCA Corporation, New York, N.Y.

[21] Appl. No.: 98,699

[22] Filed: Nov. 29, 1979

[30] Foreign Application Priority Data

Jul. 25, 1979 [GB] United Kingdom ............... 25870/79

[51] Int. Cl.³ ............................................. H01L 21/96
[52] U.S. Cl. ........................................ 29/583; 29/590
[58] Field of Search ................. 29/576, 580, 583, 589, 29/590, 591; 357/24

[56] References Cited

U.S. PATENT DOCUMENTS

| | | | |
|---|---|---|---|
| 3,800,194 | 3/1974 | Maruyama et al. | 317/30 |
| 3,864,819 | 2/1975 | Ying | 29/583 |
| 3,900,882 | 8/1975 | Fukai et al. | 357/30 |
| 3,966,512 | 6/1976 | Nonaka | 357/30 |
| 4,007,473 | 2/1977 | Nonaka et al. | 357/31 |
| 4,029,394 | 6/1977 | Araki | 350/166 |
| 4,068,253 | 1/1978 | Fuyiwara et al. | 357/31 |
| 4,099,198 | 7/1978 | Howorth et al. | 357/30 |

OTHER PUBLICATIONS

Antcliffe et al., A Backside Illuminated 400×400 Charge-Coupled Device Imager, IEEE Trans. on Electron Devices, vol. ED-23, No. 11, Nov. 1976, pp. 1225–1232.

*Primary Examiner*—Donald L. Walton
*Attorney, Agent, or Firm*—Samuel Cohen; George J. Seligsohn

[57] ABSTRACT

The front surface of a semiconductor wafer and the peripheral edge of the back surface of the wafer are protected by either coating them or by placing the wafer in a special fixture. The so protected wafer is then placed in a chemical bath and thinned to the desired thickness over the entire center region of the back surface. Then a sheet of glass which fits into the thin region within the unthinned rim on the back surface is glued to the back surface to provide a laminated structure. Next, the individual imager devices are separated from one another by cutting through the glass and thinned substrate along lines between the devices.

13 Claims, 15 Drawing Figures

MANUFACTURE OF THINNED SUBSTRATE IMAGERS

The present invention relates to imagers and more particularly, to a method of making thinned substrate imagers.

In a method embodying the invention, a semiconductor wafer with a number of imagers formed thereon is masked, for example, by placing it in a special masking fixture, or by employing a substance, such as a resist. The masking fixture or substance is made to cover the front surface (the one containing the electrodes, and so on) of the wafer and the peripheral edge of the back surface of the wafer. The wafer is then placed in a thinning bath and thinned to the desired thickness over the entire center region of the back surface, leaving only an unthinned rim around the peripheral edge of the back surface. Then a sheet of glass which fits into the thinned region is glued to the back surface to provide a laminated structure which is strong and rigid. The individual imagers are then separated from one another by cutting through the glass and thinned substrate along lines between imagers.

In the drawing, some figures of which are not to scale:

FIG. 1 illustrates a charge-coupled device (CCD) imager of the so-called field transfer type. Such an imager is available commercially from RCA Corporation and it is known as the SID 52501.

Figure 1:
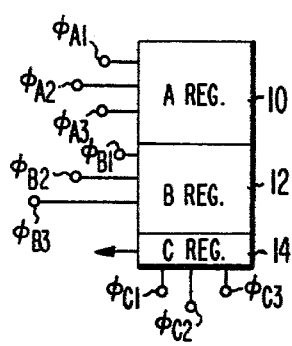
FIG. 1 is a schematic showing of a known charge-coupled device (CCD) imager of the field transfer type.

The imager of FIG. 1 includes a photosensing array 10, known as an A register, a temporary storage array 12, known as a B register, and an output register 14, known as a C register. The B and C registers are masked, that is, means (not shown) are provided for preventing a radiant energy image from reaching either register.

Figure 2:
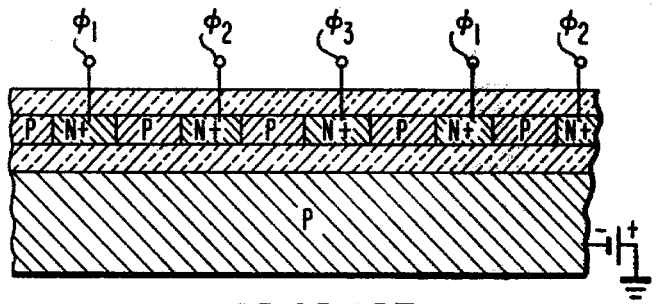
FIG. 2 is a section through the imager of FIG. 1 showing the electrode structure.

The A and B registers have channel stops (not shown) extending in the column direction to isolate the channels (the columns of the CCD) from one another. The electrodes (shown in FIG. 2) may be of the single layer type comprising, for example, N+ type regions of polysilicon separated by P-type regions of polysilicon. These electrodes extend in the row direction and in the example illustrated, are three-phase operated. The electrodes are insulated from the relatively thick P-type substrate by a layer of silicon dioxide ($SiO_2$). The SID imager mentioned above has 320 columns and 512 rows (256 in the A register and 256 in the B register), each row comprising a group of three electrodes.

The operation of the imager of FIG. 1 is well understood. During the so-called integration time, a scene or other image is projected onto the A register. The light or other radiant energy of the image causes charges to be produced at the various locations of the A register, in accordance with the light intensity reaching the respective locations.

Upon the completion of the integration time (e.g., during the vertical blanking interval of commercial television), the charge signals which have accumulated (a "field") are transferred, in parallel, in the column direction from the A to the B register by the application of the multiple phase voltages $\phi_{A1} \ldots \phi_{A3}$ and $\phi_{B1} \ldots \phi_{B3}$. The charges subsequently are transferred a row at a time, from the B register to the C register, and after each row of charges reaches the C register, it is serially shifted out of the C register in response to the shift voltages $\phi_{C1} \ldots \phi_{C3}$. The transfer of charges from the B to the C register occurs during a relatively short time (the horizontal blanking time of commercial television, which is about 10 $\mu$s) and the serial shifting of the C register occurs at relatively high speed (during the horizontal line display time of commercial television). During the transfer of a field from the B to the C register, a new field may be integrated in the A register.

For a black and white imager, the illumination of the A register occurs through the single layer electrode structure. However, if one desires to sense color information, then illumination in this way is not entirely suitable because the electrodes have high absorption at the blue end of the spectrum. For such an imager it is necessary to thin the substrate and illuminate through the back surface of the thinned substrate.

In one practical approach to thinning substrates which has been employed by RCA, the number of CCD imager devices produced on a wafer is relatively small. First, using a two-inch wafer, up to three such devices, each about 0.5"×0.8", as shown in FIG. 1, are fabricated at the same time on a common substrate, employing photolithographic techniques. Then two of the three devices are masked, that is, except for the back surface of the device being thinned, the entire wafer is coated with a substance (a "resist") which is not attached by the chemical bath (an acid) used to thin the substrate. Then the entire wafer is immersed in the thinning bath and the wafer is spun about an axis passing through the center of the device being thinned. After the desired amount of thinning of the device is obtained, the wafer is removed from the bath, the resist is removed, and then the masking and other processing steps are repeated for each additional device. Then the wafer is cut apart in such a way that there is a thick substrate border surrounding the thin region of each device. This thick border provides some stiffness and mechanical support for the relatively fragile thinned substrate region.

While the process above has resulted in the production of many operational imagers (chips), it is not without its problems. One is that it is difficult to obtain uniform thinning throughout the entire imaging portion (A register) of the device. It is thought that because of the rectangular shape of the imager device, the acid bath sometimes does not attack as strongly some of the edge and corner regions of the device as the center of the device and these edges and corners therefore are sometimes thicker in the final product than the center regions of the device. Such non-uniformity is undesirable as it sometimes causes non-uniformities in the picture information produced by the imager. Also, as a practical matter, one cannot manufacture at the same time a large number of devices on the same wafer, even a large wafer. If one were to employ a larger wafer say 4" or 5" in diameter, there would be problems in spinning the wafer during thinning about an axis considerably displaced from the center of the wafer and therefore it would be difficult to utilize the outer edge portion of the wafer (recall that the axis about which the spinning takes place passes through the center of the region being thinned). In addition, the yield using this method is not as high as desired. Also, because of the fragility of the thinned substrate, it is very difficult to test the devices after they are thinned. The reason is that the test probes tend to cause the thinned substrate to become broken or otherwise damaged.

Figure 6A:
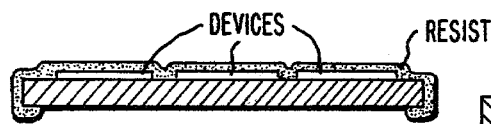
FIGS. 6A–6E illustrate steps in a manufacturing process, embodying the invention, for making thinned imagers.

The method of manufacture embodying the present invention permits numerous thinned images to be made on a single large wafer and then to be easily tested, cut out and mounted with little risk of breakage. According to this method, a relatively large (say from 2" to 5") silicon wafer with proper impurity doping is processed in the conventional way, using photolithographic techniques, to produce a relatively large number of imagers on the common thick substrate. The front surface (the surface containing the electrodes) of the wafer may now be coated with a "resist"—a substance impervious to the bath, such as an acid bath, used for thinning, as may the peripheral edge of the back surface of the wafer as shown in FIG. 6A.

Figure 7A:
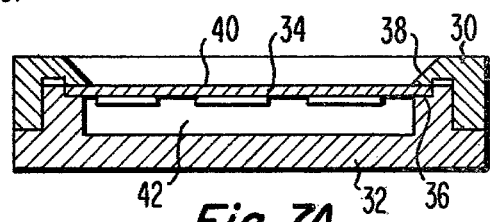
FIGS. 7A–7B illustrate the first two steps in the manufacturing process of FIG. 6, but using a masking fixture rather than a resist.
Figure 7B:
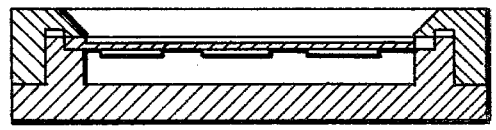

Alternatively, the wafer may be inserted into a fixture which protects the device from the acid bath in those areas where no etching is desired, as shown in FIG. 7A. The fixture includes a cap 30 and a base 32, both resistant to the acid. The wafer to be thinned is clamped at its peripheral edge between the inner peripheral notched portion 36 of the base and the inner peripheral lip 38 of the cap. The surface 40 to be thinned is exposed and the "front" surface of the chip is protected; it faces the cavity 42 within the holder. The seal between the wafer and holder is tight and prevents the acid from entering the cavity 42. To provide further protection, the cavity may be filled with water prior to sealing the wafer in the holder so that any acid which might leak into the cavity would be diluted and would not damage the devices.

Now instead of thinning the individual imagers one at a time, as in the previous process described above, the entire wafer is thinned in a rotary etching bath to the desired thickness over its entire center area, leaving only an unthinned rim around the peripheral edge of the wafer, for support, as shown in FIGS. 4, 5, 6B and 7B.

There are many possible bath mixtures which might be used as an etchant. One composition which has been found to be suitable has the following composition: 1 part hydrofluoric acid; 3 parts acetic acid; 6 parts nitric acid; bath temperature of 30° C.; etch time of 40–60 mins. The invention, of course, is not restricted to this particular bath or even to an acid bath as in some applications (depending upon the wafer material), one might use a strong base as a thinning bath.

Figure 3:
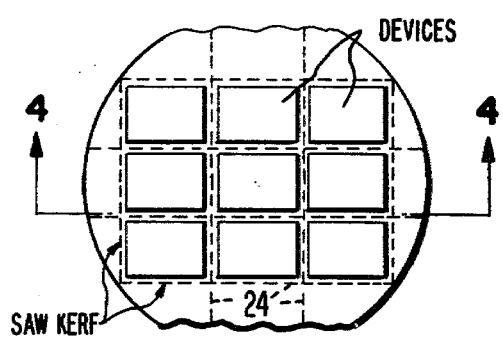
FIG. 3 is a plan view of a wafer containing a plurality of imagers which may be of the type shown in FIG. 1.
Figure 4:
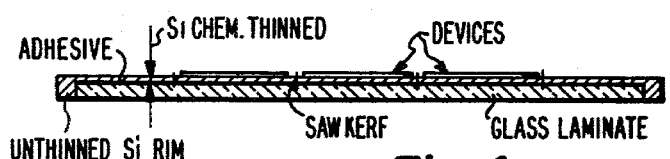
FIG. 4 is a section taken along line 4—4 of FIG. 3.
Figure 5:
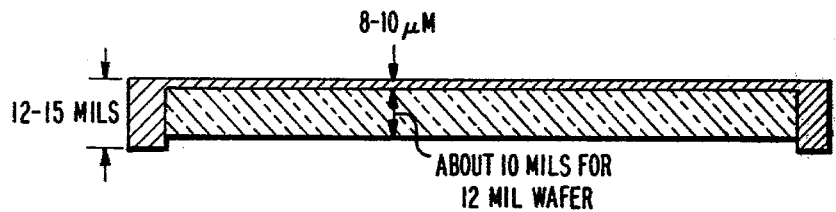
FIG. 5 shows some of the dimensions involved in producing one possible configuration of thinned substrate imagers.

FIG. 3 is a plan view of the wafer, each rectangle representing a complete imager device as shown in FIG. 1. As implied by the term "rotary," during the thinning process the wafer is spun about an axis perpendicular to the wafer surface and passing through the center of the wafer. As the wafer is round, and as there are no corners to create uniformity problems, it is possible, using this method, to obtain relatively uniform thinning. The wafer may be thinned to about 8–10 micrometers ($\mu$m) (25.4 $\mu$m = 1 mil), that is, to roughly ⅓ of a mil.

The wafer is then removed from the thinning bath and, if using a resist, the resist is removed by standard techniques, or if using a special fixture, the wafer is removed from the fixture.

Next the thinned back surface is processed both to improve its electrical and optical characteristics. For the former, a surface layer of impurities of the same type as in the bulk is diffused or implanted into the back surface to make the surface more highly doped than the bulk of the substrate. The effect is to create a potential barrier region at the back surface to lessen the tendency of photogenerated carriers to recombine at this surface. Next an anti-reflection layer may be applied to the back surface which matches the optical character of the adhesive to be discussed next. The glass disk 20 discussed above, in one practical application, is found to have the same index of refraction as the adhesive so that the surface of the glass disk which will be adjacent the back surface of the substrate need not be coated. The other surface of the glass disk—the one interfacing with air, is coated with an anti-reflection coating. This is a standard coating used in optical products, such as lenses, and the glass disk 20 can be ordered this way. While not essential, the use of the anti-reflection coatings on the back surface of the substrate and on the exposed surface of the glass disk 20 reduces the light losses through reflection and thereby improves the sensitivity of the imager.

Figure 6B:
Figure 6C:
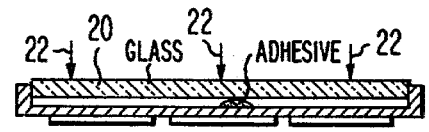

After processing the back surface of the thinned substrate, a liquid adhesive such as epoxy is placed at the center of the thinned back surface of the wafer, the back surface facing up at this time as shown in FIG. 6C. Then a circular piece of glass 20 which fits relatively closely into the thinned region, is placed over the thinned region as also shown in FIG. 6C. In one practical approach illustrated in FIG. 5, a glass disk about 10 mils thick was used for a wafer of about 12 mils thickness, although these sizes are not critical. The 10 mils thick glass is commercially available and this is one reason it is used. In another example, the glass employed is substantially thicker (about 20 mils) and extends well beyond the rim.

After the adhesive is in place, the sandwich structure may be placed in a press and pressure applied to the glass as indicated by arrows 22 in FIG. 6C. This forces the adhesive to flow across the entire surface of the glass. The adhesive, as it flows outward, drives out all air bubbles and results in a thin transparent membrane between the glass and the thinned portion of the wafer. The pressing operation is best performed in a vacuum to assist in removing all voids and bubbles from between the glass and the silicon interface. The liquid adhesive is then allowed to cure and harden, thereby producing a mechanically strong, laminated structure as shown in FIG. 6D.

After the glue has cured, the resulting laminated structure is very strong and very rigid. It is now possible to use a conventional probe station to test the individual imager devices without worrying about cracking or otherwise damaging the thinned substrate.

Figure 6D:
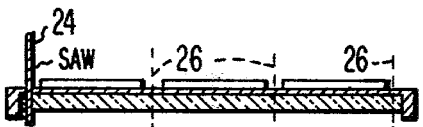
Figure 6E:
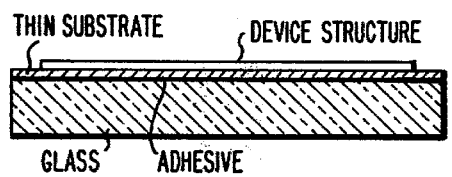

After the testing step, the individual chips, that is, the individual imager devices, each consisting of a thinned device adhering to a glass backing, may be cut apart using a conventional dicing saw, 24 as shown in FIG. 6D. The dashed lines 26 in FIGS. 3 and 6D (which are legended "saw kerf" in FIG. 3) show where other cuts are made. The cut out devices, one of which is shown in larger scale in FIG. 6E than in FIGS. 6A–6D, have sufficient strength to withstand normal mounting and handling stresses with little danger of breakage, and because the glass and adhesive are essentially colorless and highly transparent, there is substantially no loss of photosensitivity due to the presence of the glass and adhesive. In other words, the presence of the glass and the adhesive does not adversely affect the performance of the imager. Nor do the glass and adhesive adversely affect the blue sensitivity of the imager (assuming, of course, that the glass chosen is itself transparent to the blue end of the spectrum as is the case in practice). Insofar as the glue is concerned, the thickness of the glue layer is extremely small and it has little effect on the color sensitivity of the imager especially if the mating surfaces of the glass and silicon substrate are treated with an anti-reflection coating, as already discussed.

Figure 8:
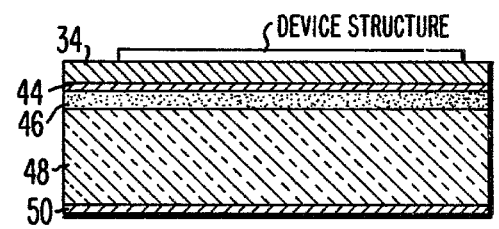
FIG. 8 is a section through a device made according to the invention, illustrating various antireflection coatings.

FIG. 8, which is not shown to scale, shows the anti-reflection coatings. The silicon of the thinned chip 34 has an index of refraction of about 3.6. The layer 44 of material deposited thereon has a thickness of about one quarter wavelength and is chosen to have an index of refraction, such as 1.95, which is between that of the adhesive 46 and that of silicon. A suitable material is silicon monoxide. The adhesive (an epoxy) has an index of refraction of 1.51 and its thickness is such as to terminate the optical stack. The glass 48 has an index of refraction of about 1.5 so that no coating is needed at the adhesive-glass interface. The glass is purchased with a commercially applied coating 50, such as used on lenses, which reduces the reflectance at the glass-air interface.

Figure 9:
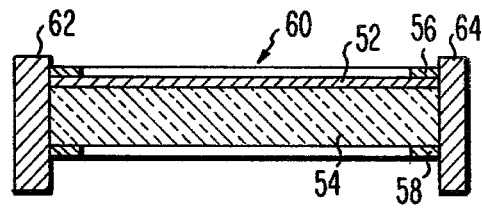
FIG. 9 illustrates the construction of a silicon vidicon target made according to the method of the invention.
Figure 10:
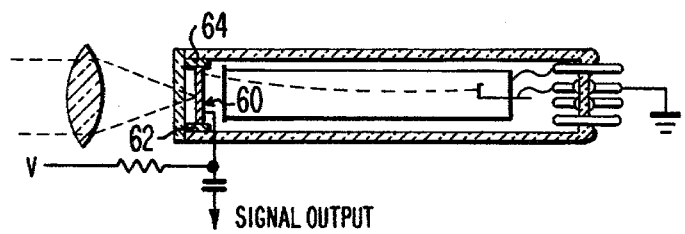
FIG. 10 illustrates a vidicon with the target of FIG. 9 in place.

While the present method has been described in terms of a CCD imager of the field transfer type, it is to be appreciated that is is also applicable to other forms of CCD imagers, to other forms (non CCD) of solid state imagers, and also to camera tube targets such as silicon vidicon targets. FIG. 9 illustrates the construction of such a target. The silicon target 52 is thinned in the same way as discussed above and is laminated onto the glass substrate 54 also in the same way as already discussed. The retaining rings 56, 58 hold the laminated structure 60 in place in the mounting fixture 62, 64. The vidicon with the laminated structure 60 in place, is shown schematically in FIG. 10, the glass layer facing the tube envelope and the silicon target facing the electron gun so that, in operation, it is scanned by the electron beam.

What is claimed is:

1. A method of manufacturing thinned substrate imagers comprising the steps of:
    masking one surface, hereafter termed the "front surface" and the peripheral edge of the opposite surface, hereafter termed the "back surface" of a wafer formed of the substrate to prevent attack by the thinning bath described in the following step:
    placing the wafer in a thinning bath which attacks that part of the wafer which is not masked, for a length of time sufficient to remove the unmasked portion of the back surface to a desired depth, whereby there remains a thinned wafer with an unthinned rim around its peripheral edge;
    removing the thinned wafer from the bath; and
    glueing to the thinned region of the back surface of the wafer, a sheet of glass which fits into wafer within the unthinned rim thereof.

2. The method of claim 1 wherein the wafer comprises one formed of silicon.

3. The method of claim 1 wherein the sheet of glass, when in place in the thinned region of the wafer, is of a thickness roughly comparable to the thickness of substrate removed from the back surface of the wafer during the thinning process.

4. The method of claim 1 wherein the sheet of glass, when in place in the thinned region of the wafer, is of a thickness which is substantially greater than the thickness of the substrate removed from the back surface of the wafer during the thinning process.

5. The method of claim 1 wherein the wafer is not more than about 15 mils thick, before thinning, and is thinned to a fraction of a mil.

6. The method of claim 1 wherein the glueing step is carried out in a vacuum while applying pressure to the glass.

7. The method as set forth in claim 1 wherein, during thinning, the wafer is spun about an axis passing through the center portion of the wafer and perpendicular to its surfaces.

8. The method as set forth in claim 1, wherein the front surface of the wafer is formed with a plurality of imager devices thereon, and further including the step of:
    cutting apart the laminated structure produced by following the steps of claim 1 along lines between the imager devices to thereby produce a plurality of devices, each comprising an imager device with thinned substrate laminated to a glass sheet glued to the back surface of a device.

9. The method as set forth in claim 8 wherein the imager devices comprise charge-coupled devices.

10. The method as set forth in claim 8 wherein the imager devices comprise silicon vidicon targets.

11. The method as set forth in claim 8 wherein said wafer is round, said thinning bath comprises an acid bath, and wherein, while the wafer is in the bath, it is spun about an axis passing through the center of the wafer and perpendicular to the surface of the wafer.

12. The method as set forth in claim 1, including the further step, after the thinning step and before the glueing step of:
    placing a coating of material on the back surface of the thinned wafer having an index of refraction of a value between that of the wafer and that of the glue and a thickness such as to substantially reduce reflection of light from the glue-substrate interface.

13. The method as set forth in claim 8, including the further step, after the thinning step and before the glueing step of:
    placing a coating of material on the back surface of the thinned wafer having an index of refraction of a value between that of the wafer and that of the glue and a thickness such as to substantially reduce reflection of light from the glue-substrate interface.

* * * * *